United States Patent
Kang et al.

(10) Patent No.: US 10,325,936 B2
(45) Date of Patent: Jun. 18, 2019

(54) DISPLAY DEVICE HAVING LIGHT EMITTING DIODE DISPOSED IN THE CONCAVE PORTION OF THE PLANARIZATION LAYER

(71) Applicants: LG Display Co., Ltd., Seoul (KR); LG INNOTEK Co., Ltd., Seoul (KR); LG Electronics Inc., Seoul (KR)

(72) Inventors: HanSaem Kang, Paju-si (KR); HyeonHo Son, Goyang-si (KR); KyungHan Seo, Paju-si (KR); Sangyoul Lee, Paju-si (KR); Hwankuk Yuh, Yongin-si (KR); Seung Ouk Noh, Pyeongtaek-si (KR)

(73) Assignees: LG DISPLAY CO., LTD., Seoul (KR); LG INNOTEK CO., LTD., Seoul (KR); LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/797,835

(22) Filed: Oct. 30, 2017

(65) Prior Publication Data
US 2018/0122837 A1 May 3, 2018

(30) Foreign Application Priority Data
Oct. 28, 2016 (KR) .......................... 10-2016-0141670

(51) Int. Cl.
*H01L 27/32* (2006.01)
*H01L 27/12* (2006.01)
(Continued)

(52) U.S. Cl.
CPC ...... *H01L 27/1248* (2013.01); *H01L 25/0753* (2013.01); *H01L 27/124* (2013.01); *H01L 33/38* (2013.01)

(58) Field of Classification Search
CPC . H01L 27/32; H01L 27/2225; H01L 27/3258; H01L 2227/32
See application file for complete search history.

(56) References Cited

U.S. PATENT DOCUMENTS

| 5,402,141 A | 3/1995 | Haim et al. |
| 2005/0181548 A1 | 8/2005 | Yanagisawa et al. |

(Continued)

FOREIGN PATENT DOCUMENTS

| EP | 0560272 A2 | 9/1993 |
| EP | 2618392 A2 | 9/1993 |
| WO | WO 2015/175131 A1 | 11/2015 |

*Primary Examiner* — Hoai V Pham
(74) *Attorney, Agent, or Firm* — Birch, Stewart, Kolasch & Birch, LLP

(57) ABSTRACT

Disclosed is a light emitting diode display device in which a time taken in a process of connecting a light emitting device to a pixel circuit is shortened. The light emitting diode display device includes a thin film transistor (TFT) array substrate including a concave portion and a light emitting device disposed in the concave portion. The light emitting device includes a first electrode and a second electrode. The light emitting device further includes a first portion, including the first and second electrodes, and a second portion opposite to the first portion, and a distance between the first portion to a floor surface of the concave portion is greater than a distance between the second portion to the floor surface of the concave portion.

26 Claims, 4 Drawing Sheets

(51) Int. Cl.
*H01L 33/38* (2010.01)
*H01L 25/075* (2006.01)

(56) References Cited

U.S. PATENT DOCUMENTS

| | | |
|---|---|---|
| 2008/0194054 A1 | 8/2008 | Lin et al. |
| 2013/0187179 A1 | 7/2013 | Tan et al. |
| 2015/0084054 A1 | 3/2015 | Fan et al. |
| 2015/0333221 A1 | 11/2015 | Bibl et al. |
| 2017/0278913 A1* | 9/2017 | Zhang ................ H01L 27/3246 |

* cited by examiner

DISPLAY DEVICE HAVING LIGHT EMITTING DIODE DISPOSED IN THE CONCAVE PORTION OF THE PLANARIZATION LAYER

CROSS-REFERENCE TO RELATED APPLICATIONS

This application claims the priority benefit of the Korean Patent Application No. 10-2016-0141670 filed on Oct. 28, 2016, the disclosure of which is incorporated herein by reference in its entirety.

BACKGROUND OF THE INVENTION

Field of the Invention

The embodiments of the present disclosure relate to a display device, and more particularly, to a light emitting diode display device.

Discussion of the Related Art

Display devices are being widely used as a display screen of notebook computers, tablet computers, smartphones, portable display devices, and portable information devices in addition to a display screen of television (TVs) and monitors.

Liquid crystal display (LCD) devices and organic light emitting display (OLED) devices display an image by using thin film transistors (TFTs) as switching elements. Since the LCD devices cannot self-emit light, the LCD devices display an image by using light emitted from a backlight unit which is disposed under a liquid crystal display panel. Since the LCD devices include a backlight unit, a design of the LCD devices is limited, and luminance and a response time are reduced. Since the OLED devices include an organic material, the OLED devices are vulnerable to water, causing a reduction in reliability and lifetime.

Recently, research and development are being done on light emitting diode display devices including a micro light emitting device. The light emitting diode display devices have high image quality and high reliability, and thus, are attracting much attention as next-generation display devices.

However, in a related art light emitting diode display device, much time is taken in heating or cooling a substrate for bonding a light emitting device to a pixel circuit with a conductive adhesive in a process of transferring a micro light emitting device onto a TFT array substrate, and for this reason, productivity is reduced.

SUMMARY OF THE INVENTION

Accordingly, the embodiments of the present disclosure are directed to provide a light emitting diode display device that substantially obviates one or more problems due to limitations and disadvantages of the related art.

An aspect of the present disclosure is directed to provide a light emitting diode display device in which a time taken in a process of connecting a light emitting device to a pixel circuit is shortened.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device including a thin film transistor (TFT) array substrate including a concave portion and a light emitting device disposed in the concave portion, the light emitting device including a first portion and a second portion opposite to the first portion, and the first portion including a first electrode and a second electrode. A distance between the first portion to a floor surface of the concave portion is greater than a distance between the second portion to the floor surface of the concave portion.

The TFT array substrate may further include a planarization layer including the concave portion, and the concave portion may be provided concavely from a top surface of the planarization layer.

A pixel according to the present disclosure may include a pixel circuit including a driving TFT covered by the planarization layer. The pixel circuit may include a pixel electrode pattern electrically connected to the driving TFT through a first contact hole provided in the planarization layer and directly electrically connected to the first electrode of the light emitting device, and a common electrode pattern directly electrically connected to the second electrode of the light emitting device.

In another aspect of the present disclosure, there is provided a display device including a thin film transistor (TFT) array substrate including a concave portion; and a light emitting device in the concave portion, the light emitting device including a first electrode and a second electrode, wherein light emitted from the light emitting device passes through each of the first and second electrodes and is output to the outside.

In another aspect of the present disclosure, there is provided a display device comprising: pixels each including a driving TFT provided on a substrate; a planarization layer covering the pixels; a concave portion in the planarization layer; and a light emitting device, wherein the light emitting device is accommodated into the concave portion provided in an emissive area of a corresponding pixel.

It is to be understood that both the foregoing general description and the following detailed description of the present disclosure are by example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
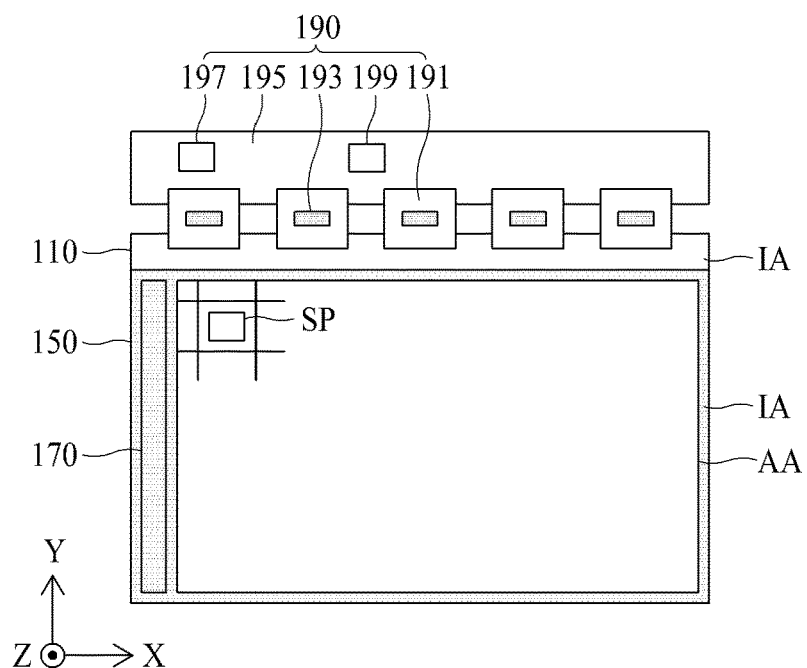
FIG. 1 is a diagram for describing a configuration of a light emitting diode display device according to an embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In an instance where 'comprise', 'have', and 'include' described in the present specification are used, another part may be added unless 'only~' is used. The terms of a singular form may include plural forms unless referred to the contrary.

In construing an element, the element is construed as including an error range although there may be no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is strictly vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, example embodiments of a light emitting diode display device according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
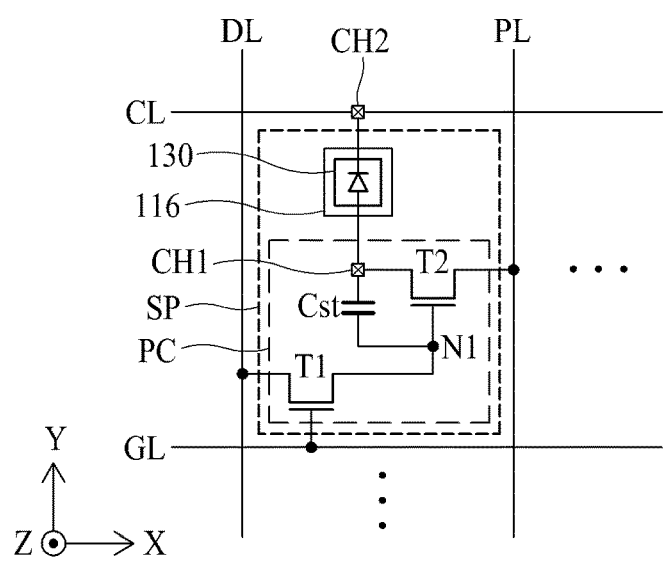
FIG. 2 is a circuit diagram for describing a configuration of a pixel illustrated in FIG. 1.

FIG. 1 is a diagram for describing a configuration of a light emitting diode display device according to an embodiment of the present disclosure, and FIG. 2 is a circuit diagram for describing a configuration of a pixel illustrated in FIG. 1. All the components of the light emitting diode display device according to all embodiments of the present disclosure are operatively coupled and configured.

Referring to FIGS. 1 and 2, the light emitting diode display device according to an embodiment of the present disclosure may include a first substrate 110, a plurality of light emitting devices 130, and a second substrate 150.

The first substrate 110 may be a thin film transistor (TFT) array substrate and may be formed of glass, a plastic material, and/or the like. The first substrate 110 according to an embodiment may include a display area (or an active area) AA and a non-display area (or an inactive area) IA.

The display area AA may be provided in a portion other than an edge of the first substrate 110. The display area AA may be defined as an area where a pixel array displaying an image is provided.

The non-display area IA may be provided in a portion other than the display area AA provided on the substrate 110 and may be defined as the edge of the first substrate 110 surrounding the display area AA. The non-display area IA may be a peripheral portion outside the display area AA and cannot display an image unlike the display area AA, and moreover, the non-display area IA may be defined as an area where lines and circuits for driving the pixel array are disposed. For example, the non-display area IA may include a first non-display area defined in a peripheral portion outside an upper side of the display area AA, a second non-display area defined in a peripheral portion outside a lower side of the display area AA, a third non-display area defined in a peripheral portion outside a left side of the display area AA, and a fourth non-display area defined in a peripheral portion outside a right side of the display area AA.

The first substrate 110 according to an embodiment may include a plurality of gate lines GL, a plurality of data lines DL, a plurality of driving power lines PL, a plurality of common power lines CL, and a plurality of pixels SP.

The plurality of gate lines GL may be provided on the first substrate 110, may long extend along a first horizontal axis direction X of the first substrate 110, may be arranged along a second horizontal axis direction Y, and may be spaced apart from each other by a certain interval. In this instance, the first horizontal axis direction X may be defined as a direction parallel to a long side length direction of the first substrate 110, and the second horizontal axis direction Y may be defined as a direction parallel to a short side length direction of the first substrate 110. Alternatively, each of the first horizontal axis direction X and the second horizontal axis direction Y may be defined as a direction opposite thereto.

The plurality of data lines DL may be provided on the first substrate 110 to intersect the plurality of gate lines GL, may long extend along the second horizontal axis direction Y of the first substrate 110, may be arranged along the first horizontal axis direction X, and may be spaced apart from each other by a certain interval.

The plurality of driving power lines PL may be provided on the first substrate 110 in parallel with the plurality of data lines DL and may be formed along with the plurality of data lines DL. Each of the plurality of driving power lines PL may supply a pixel driving power, supplied from the outside, to an adjacent pixel SP.

The plurality of driving power lines PL may be connected in common to one first driving power common line provided in the first non-display area of the first substrate 110 in parallel with the gate line GL. The one first driving power common line may distribute the pixel driving power, supplied from the outside, to the plurality of driving power lines PL. The first driving power common line may be provided on the same layer as the gate line GL, electrically disconnected from each of the plurality of data lines DL, and electrically connected to an end of each of the plurality of driving power lines PL through a via hole.

In addition, the pixel driving power may be supplied to one end and another end of each of the plurality of driving power lines PL. To this end, the one end of each of the plurality of driving power lines PL may be connected to the one first driving power common line provided in the first non-display area of the first substrate 110, and the other end of each of the plurality of driving power lines PL may be connected to the one second driving power common line provided in the second non-display area of the first substrate 110. In this instance, according to an embodiment of the present disclosure, the pixel driving power may be applied to an upper end and a lower end of each of the plurality of driving power lines PL through the first and second driving power common lines, thereby minimizing the voltage drop of the pixel driving power which occurs in each of the plurality of driving power lines PL due to a position-based line resistance of each of the plurality of driving power lines PL.

The first and second driving power common lines may be provided on the same layer as the plurality of gate lines GL and may be electrically connected to the end of each of the plurality of driving power lines PL through the via hole.

The plurality of common power lines CL may be arranged on the first substrate 110 in parallel with the plurality of gate lines GL and may be formed along with the plurality of gate lines GL. Each of the plurality of common power lines CL may supply a common power, supplied from the outside, to an adjacent pixel SP. Each of the plurality of common power lines CL may be individually supplied with the common power from a panel driver 190. In this instance, the panel driver 190 may individually control a voltage level of the common power supplied to each of the plurality of common power lines CL to compensate for an electrical characteristic of the light emitting devices 130 and/or an electrical characteristic change of a below-described driving TFT.

In addition, the plurality of common power lines CL may be connected in common to a common power supply line provided in at least one of the third and fourth non-display areas of the first substrate 110. The common power supply line may distribute the common power, supplied from the outside, to the plurality of common power lines CL. The common power supply line may be provided on the same layer as the data lines DL, electrically disconnected from each of the plurality of gate lines GL, and electrically connected to an end of each of the plurality of common power lines CL through a via hole.

The plurality of pixels SP may be respectively provided in a plurality of pixel areas defined by intersections of the gate lines GL and the data lines DL. Each of the plurality of pixels SP may be an area corresponding to a minimum unit where light is actually emitted, and may be defined as a subpixel. At least three adjacent pixels SP may configure one unit pixel for displaying colors. For example, the one unit pixel may include a red pixel, a green pixel, and a blue pixel which are adjacent to each other, and may further include a white pixel for enhancing luminance. In FIG. 2, for convenience of description, One example of only one pixel SP is illustrated. However, each pixel SP has the configuration of the pixel shown in FIG. 2.

Each of the plurality of pixels SP may include a pixel circuit PC and a concave portion 116.

Each pixel circuit PC may be provided in a circuit area defined in a corresponding pixel SP and may be connected to a gate line GL, a data line DL, and a driving power line PL which are adjacent thereto. Each pixel circuit PC may control a current flowing in the light emitting device 130 according to a data signal supplied through the data line DL in response to a scan pulse supplied through the gate line GL, based on the pixel driving power supplied through the driving power line PL. The pixel circuit PC according to an embodiment may include a switching TFT T1, a driving TFT T2, and a capacitor Cst.

For each pixel SP, the switching TFT T1 may include a gate electrode connected to the gate line GL, a first electrode connected to the data line DL, and a second electrode connected to a gate electrode N1 of the driving TFT T2. In this instance, each of the first and second electrodes of the switching TFT T1 may be a source electrode or a drain electrode according to a direction of a current. The switching TFT T1 may be turned on according to the scan pulse supplied through the gate line GL and may supply the data signal, supplied through the data line DL, to the driving TFT T2.

The driving TFT T2 may be turned on by a voltage supplied through the switching TFT T1 and/or a voltage of the capacitor Cst to control the amount of current flowing from the driving power line PL to the light emitting device 130. To this end, the driving TFT T2 according to an embodiment may include a gate electrode connected to the second electrode N1 of the switching TFT T1, a drain electrode connected to the driving power line PL, and a source electrode connected to the light emitting device 130. The driving TFT T2 may control a data current flowing from the driving power line PL to the light emitting device 130 according to the data signal supplied through the switching TFT T1, thereby allowing the light emitting device 130 to emit light having brightness proportional to the data signal.

The capacitor Cst may be provided in an overlap area between the gate electrode N1 and the source electrode of the driving TFT T2, may store a voltage corresponding to the data signal supplied to the gate electrode of the driving TFT T2, and may turn on the driving TFT T2 with the stored voltage.

Each concave portion 116 may be provided in an emissive area defined in the corresponding pixel SP and may accommodate the corresponding light emitting device 130. In this instance, the emissive area of the pixel SP may be defined as an area other than a circuit area with the pixel circuit PC provided therein in a corresponding pixel area.

The concave portion 116 according to an embodiment may be provided concavely from a planarization layer (or a passivation layer) provided on the first substrate 110 to cover the pixel circuit PC. For example, the concave portion 116 may have a groove shape or a cup shape having a certain depth from a top surface of the planarization layer. The concave portion 116 may be concavely provided in the planarization layer and may accommodate the light emitting device 130, thereby minimizing an increase in thickness of a display device caused by a thickness (or a depth) of the light emitting device 130.

Each of the plurality of light emitting devices 130 may be accommodated into the concave portion 116 provided in a corresponding pixel SP of the plurality of pixels SP. Each of the plurality of light emitting devices 130 may be connected to the pixel circuit PC of a corresponding pixel SP, and thus, may emit light having brightness proportional to a current flowing from the pixel circuit PC (i.e., the driving TFT T2) to the common power line CL. Each of the light emitting devices 130 according to an embodiment may be a light emitting diode device or a light emitting diode chip which emits one of red light, green light, blue light, and white light, and for example, may be a micro light emitting diode chip. In this instance, the micro light emitting diode chip may have a scale of 1 µm to 100 µm, but is not limited thereto. In other embodiments, the micro light emitting diode chip may have a size which is smaller than a size of an emissive area other than an area occupied by the pixel circuit PC in a corresponding pixel area.

The plurality of light emitting devices 130 according to an embodiment may each include a first electrode connected to the source electrode of the driving TFT T2 through a first contact hole CH1, a second electrode connected to the common power line CL through a second contact hole CH2, and a light emitting layer provided between the first electrode and the second electrode. Each of the plurality of light emitting devices 130 may be accommodated into the concave portion 116 and may be exposed in a direction toward an upper portion of the concave portion 116 without being covered by the concave portion 116. That is, each of the plurality of light emitting devices 130 may include a first portion where the first and second electrodes are provided and a second portion opposite to the first portion, and may be accommodated into the concave portion 116 so that the first portion is disposed relatively farther apart from a floor surface 116a (see FIG. 3) of the concave portion 116 than the second portion and is adjacent to an image display surface. In embodiments of the present disclosure, a distance between the first portion to the floor surface 116a of the concave portion 116 may be greater than a distance between the second portion to the floor surface 116a of the concave portion 116.

A structure of each of the light emitting devices 130 will be described below.

The second substrate 150 may be disposed to cover the first substrate 110 and may be defined as a color filter array substrate, an opposite substrate, or an encapsulation substrate. The second substrate 150 may be opposite-bonded to the first substrate 110 by a sealant surrounding the display area AA of the first substrate 110.

In addition, the light emitting diode display device according to an embodiment of the present disclosure may further include a scan driving circuit 170 and a panel driver 190.

The scan driving circuit 170 may generate the scan pulse according to a gate control signal input from the panel driver 190 and may supply the scan pulse to the gate lines GL. The scan driving circuit 170 may be built into the third non-display area of the first substrate 110 through a process which is the same as a process of forming the TFTs provided in each pixel SP. For example, the scan driving circuit 170 may be provided in a left and/or right non-display area with respect to the display area AA, but is not limited thereto. In other embodiments, the scan driving circuit 170 may be provided in an arbitrary non-display area which enables the scan pulse to be supplied to the gate lines GL.

Optionally, the scan driving circuit 170 may be manufactured as a driving integrated circuit (IC) type. In this instance, the scan driving circuit 170 according to an embodiment may be mounted in the third and/or fourth non-display area of the first substrate 110 so as to be connected to the plurality of gate lines in a one-to-one correspondence relationship. According to another embodiment, the scan driving circuit 170 may be mounted on a gate flexible circuit film, and in this instance, the gate flexible circuit film may be attached on a gate pad part provided in the third and/or fourth non-display area of the first substrate 110, whereby the scan driving circuit 170 may be connected to the plurality of gate lines GL through the gate flexible circuit film and the gate pad part in a one-to-one correspondence relationship.

The panel driver 190 may be connected to a pad part provided in the first non-display area of the first substrate 110 and may display an image, corresponding to image data supplied from a display driving system, on the display area AA. The panel driver 190 according to an embodiment may include a plurality of data flexible circuit films 191, a plurality of data driving ICs 193, a printed circuit board (PCB) 195, a timing controller 197, and a power circuit 199.

Each of the plurality of data flexible circuit films 191 may be attached on the pad part of the first substrate 110 through a film attachment process.

Each of the plurality of data driving ICs 193 may be individually mounted on a corresponding data flexible circuit film of the plurality of data flexible circuit films 191. The data driving ICs 193 may receive pixel data and a data control signal supplied from the timing controller 197, convert the pixel data into analog data voltages by pixels according to the data control signal, and respectively supply the analog data voltages to the data lines DL.

The PCB 195 may be connected to the plurality of data flexible circuit films 191. The PCB 195 may support the timing controller 197 and the power circuit 199 and may transfer signals and power between the elements of the panel driver 190.

The timing controller 197 may be mounted on the PCB 195 and may receive image data and a timing synchronization signal supplied from the display driving system through a user connector provided on the PCB 195. The timing controller 197 may align the image data according to a pixel arrangement structure of the display area AA based on the timing synchronization signal to generate pixel data and may supply the generated pixel data to the data driving ICs 193. Also, the timing controller 197 may generate the data control signal and the gate control signal, based on the timing synchronization signal and may control a driving timing of each of the data driving ICs 193 and the scan driving circuit 170.

The power circuit 199 may be mounted on the PCB 195 and may generate various voltages necessary for displaying an image on the display area AA by using an input power received from the outside to supply each of the voltages to a corresponding element.

In addition, the panel driver 190 may further include a control board connected to the PCB 195. In this instance, the timing controller 197 and the power circuit 199 may be mounted on the control board without being mounted on the PCB 195. Accordingly, the PCB 195 may perform only a function of transferring signals and power between the plurality of data flexible circuit films 191 and the control board.

In the light emitting diode display device according to an embodiment of the present disclosure, since each of the light emitting devices 130 is accommodated into the concave portion 116 provided in the emissive area of a corresponding pixel SP, a misalignment of the light emitting devices 130 transferred onto the pixels SP is prevented or reduced from occurring in a transfer process performed for the light emitting devices 130, and an alignment precision of the light emitting devices 130 is improved. Particularly, in the light emitting diode display device according to an embodiment of the present disclosure, since the electrodes of each of the light emitting devices 130 are greatly spaced apart from the floor surface 116a of the concave portion 116 and are connected to the pixel circuit PC through the contract holes CH1 and CH2, a connection process of connecting the light emitting device 130 and the pixel circuit PC is simplified, and a process time taken in connecting the light emitting device 130 and the pixel circuit PC is shortened.

Figure 3:
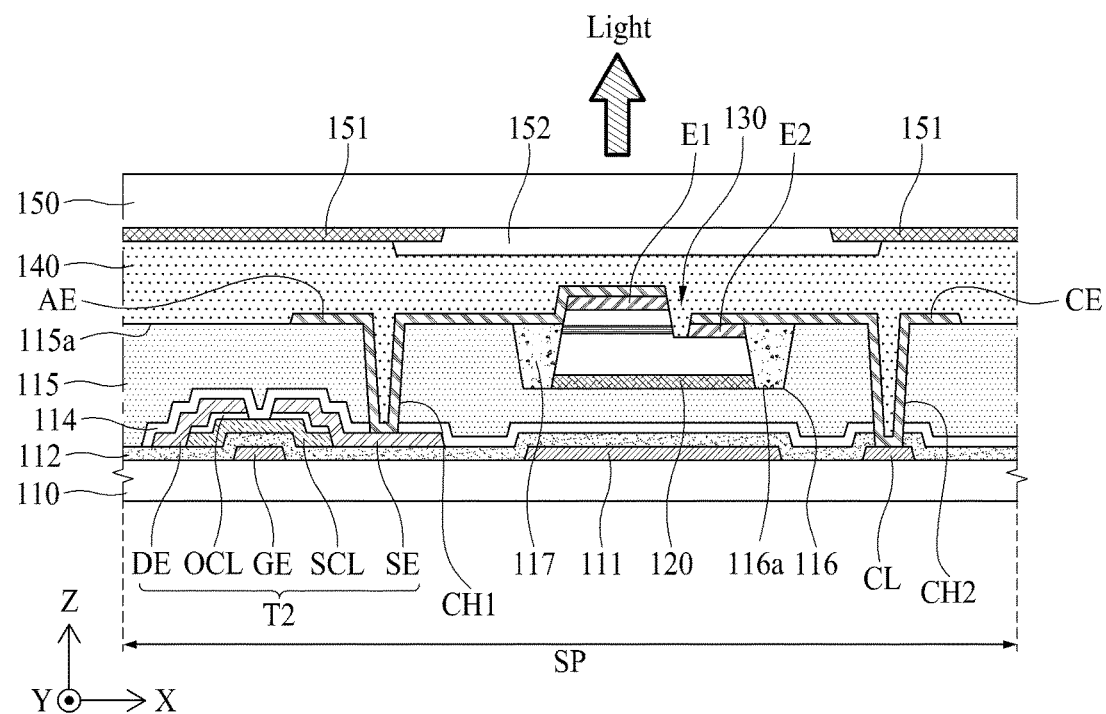
FIG. 3 is a cross-sectional view for describing a connection structure of a driving TFT and a light emitting device illustrated in FIG. 2.
Figure 4:
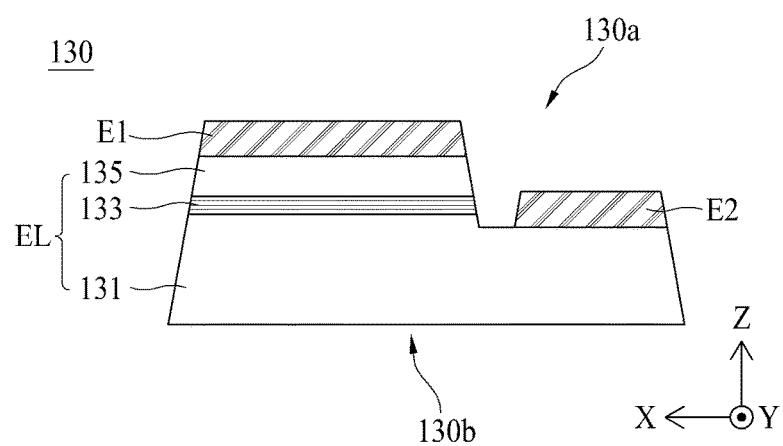
FIG. 4 is a cross-sectional view for describing the light emitting device illustrated in FIG. 3.

FIG. 3 is a cross-sectional view for describing a connection structure of the driving TFT and the light emitting device illustrated in FIG. 2, and FIG. 4 is a cross-sectional view for describing the light emitting device illustrated in FIG. 3.

An example of each of the first substrate 110, the light emitting device 130, and the second substrate 150 will be described below with reference to FIGS. 3 and 4 along with FIG. 2.

Referring to FIGS. 2-4, the first substrate 110 according to an embodiment of the present disclosure may include the pixel circuit PC including the driving TFT T2, the planarization layer 115 covering the pixel circuit PC, and the concave portion 116.

The driving TFT T2 may include a gate electrode GE, a semiconductor layer SCL, an ohmic contact layer OCL, a source electrode SE, and a drain electrode DE.

The gate electrode GE may be formed on the first substrate 110 along with the gate lines GL. The gate electrode GE may be covered by a gate insulation layer 112.

The gate insulation layer 112 may be formed of a single layer or a multilayer including an inorganic material and may be formed of silicon oxide (SiOx) silicon nitride (SiNx), and/or the like.

The semiconductor layer SCL may be provided in a predetermined pattern (or island) type on the gate insulation layer 112 to overlap the gate electrode GE. The semiconductor layer SCL may be formed of a semiconductor material including one of amorphous silicon, polycrystalline silicon, oxide, and an organic material, but is not limited thereto.

The ohmic contact layer OCL may be provided in a predetermined pattern (or island) type on the semiconductor layer SCL. In this instance, the ohmic contact layer OCL is for an ohmic contact between the semiconductor layer SCL and the source and drain electrodes SE and DE and may be omitted.

The source electrode SE may be formed on one side of the ohmic contact layer OCL to overlap one side of the semiconductor layer SCL. The source electrode SE may be formed along with the data lines DL and the driving power lines PL.

The drain electrode DE may be formed on the other side of the ohmic contact layer OCL to overlap the other side of the semiconductor layer SCL and may be spaced apart from the source electrode SE. The drain electrode DE may be formed along with the source electrode SE and may branch or protrude from an adjacent driving power line PL.

In addition, the switching TFT T1 configuring the pixel circuit PC may be formed in a structure which is the same as that of the driving TFT T2. In this instance, the gate electrode of the switching TFT T1 may branch or protrude from the gate line GL, the first electrode of the switching TFT T1 may branch or protrude from the data line DL, and the second electrode of the switching TFT T1 may be connected to the gate electrode GE of the driving TFT T2 through a via hole provided in the gate insulation layer 112.

The pixel circuit PC may be covered by an interlayer insulation layer 114. The interlayer insulation layer 114 may be provided all over the first substrate 110 to cover the pixel circuit PC including the driving TFT T2. The interlayer insulation layer 114 according to an embodiment may be formed of an inorganic material, such as SiOx or SiNx, or an organic material such as benzocyclobutene or photo acryl. The interlayer insulation layer 114 may not be provided.

The planarization layer (or the passivation layer) 115 may be provided all over the first substrate 110 to cover the interlayer insulation layer 114. The planarization layer 115 may protect the pixel circuit PC including the driving TFT T2 and may provide a planar surface on the interlayer insulation layer 114. The planarization layer 115 according to an embodiment may be formed of an organic material such as benzocyclobutene or photo acryl, and particularly, may be formed of photo acryl for convenience of a process.

The concave portion 116 may be provided in an emissive area defined in the pixel SP and may accommodate the light emitting device 130. In this instance, the emissive area of the pixel SP may be defined as an area other than a circuit area with the pixel circuit PC provided therein in a pixel area.

The concave portion 116 according to an embodiment may be provided concavely from the planarization layer 115 provided on the first substrate 110 to cover the pixel circuit PC. In this instance, the concave portion 116 may be provided concavely from the top 115a of the planarization layer 115 to have a depth corresponding to a thickness (or a total height) of the light emitting device 130. In this instance, the floor surface 116a of the concave portion 116 may be formed by removing a portion of the planarization layer 115, a whole portion of the planarization layer 115, the whole portion of the planarization layer 115 and a portion of the interlayer insulation layer 114, or the whole portion of the planarization layer 115 and the interlayer insulation layer 114, and a whole portion of the gate insulation layer 112 which overlaps the emissive area of the pixel SP, in order to have a depth which is set based on the thickness of the light emitting device 130. For example, the concave portion 116 may be provided to have a depth of 2 µm to 6 µm from the top 115a of the planarization layer 115. The concave portion 116 may have a cup shape having a size of the floor surface 116a which is wider than a second portion 130b of the light emitting device 130.

The concave portion 116 according to an embodiment may include an inclined surface provided between the floor surface 116a of the concave portion 116 and the top 115a of the planarization layer 115, and the inclined surface may allow light emitted from the light emitting device 130 to travel toward the front of concave portion 116.

The light emitting device 130 according to an embodiment may be accommodated into the concave portion 116 provided in the pixel SP and may be connected to the pixel circuit PC. The light emitting device 130 may include a first portion 130a, including the first and second electrodes E1 and E2 connected to the pixel circuit PC, and a second portion 130b opposite to the first portion 130a. In this instance, the first portion 130a of the light emitting device 130 may be disposed relatively farther away from the floor surface 116a of the concave 116 than the second portion 130b. That is, in the light emitting device 130, the first and second electrodes E1 and E2 provided in the first portion 130a may be disposed in the concave portion 116 to face the second substrate 150 without being disposed to face the inside of the concave portion 116, namely, the floor surface 116a of the concave portion 116. In this instance, the first portion 130a of the light emitting device 130 may have a size which is smaller than the second portion 130b, and in this instance, the light emitting device 130 may have a cross-sectional surface having a trapezoid shape.

The light emitting device 130 according to an embodiment may include a light emitting layer EL, the first electrode E1, and the second electrode E2.

The light emitting layer EL may emit light according to a recombination of an electron and a hole based on a current flowing between the first electrode E1 and the second electrode E2. The light emitting layer EL according to an embodiment may include a first semiconductor layer 131, an active layer 133, and a second semiconductor layer 135.

The first semiconductor layer 131 may supply an electron to the active layer 133. The first semiconductor layer 131 according to an embodiment may be formed of an n-GaN-based semiconductor material, and examples of the n-GaN-based semiconductor material may include GaN, AlGaN, InGaN, AlInGaN, etc. In this instance, silicon (Si), germanium (Ge), selenium (Se), tellurium (Te), or carbon (C) may be used as impurities used for doping of the first semiconductor layer 131.

The active layer 133 may be provided on one side of the first semiconductor layer 131. The active layer 133 may have a multi quantum well (MQW) structure which includes a well layer and a barrier layer which is higher in band gap than the well layer. The active layer 133 according to an embodiment may have an MQW structure of InGaN/GaN or the like.

The second semiconductor layer 135 may be provided on the active layer 133 and may supply a hole to the active layer 133. The second semiconductor layer 135 according to an embodiment may be formed of a p-GaN-based semiconductor material, and examples of the p-GaN-based semiconductor material may include GaN, AlGaN, InGaN, AlInGaN, etc. In this instance, magnesium (Mg), zinc (Zn), or beryllium (Be) may be used as impurities used for doping of the second semiconductor layer 135.

In addition, the first semiconductor layer 131, the active layer 133, and the second semiconductor layer 135 may be provided in a structure of being sequentially stacked on a semiconductor substrate. In this instance, the semiconductor substrate may include a semiconductor material included in a sapphire substrate or a silicon substrate. The semiconductor substrate may be used as a growth semiconductor substrate for growing each of the first semiconductor layer 131, the active layer 133, and the second semiconductor layer 135, and then, may be separated from the first semiconductor layer 131 through a substrate separation process. In this instance, the substrate separation process may be a laser lift-off process or a chemical lift-off process. Therefore, since the growth semiconductor substrate is removed from the light emitting device 130, the light emitting device 130 has a thin thickness, and thus, may be accommodated into the concave portion 116 provided in the pixel SP.

The first electrode E1 may be provided on the second semiconductor layer 135. The first electrode E1 may be connected to the source electrode SE of the driving TFT T2.

The second electrode E2 may be provided on the other side of the first semiconductor layer 131 and may be electrically disconnected from the active layer 133 and the second semiconductor layer 135. The second electrode E2 may be connected to the common power line CL.

Each of the first and second electrodes E1 and E2 according to an embodiment may be formed of a transparent conductive material, and examples of the transparent conductive material may include indium tin oxide (ITO), indium zinc oxide (IZO), etc. However, the present embodiment is not limited thereto. In other embodiments, each of the first and second electrodes E1 and E2 may be formed of a material including one or more materials of a metal material, such as gold (Au), tungsten (W), platinum (Pt), iridium (Ir), silver (Ag), copper (Cu), nickel (Ni), titanium (Ti), or chromium (Cr), and an alloy thereof.

The light emitting device 130 may emit the light according to the recombination of the electron and the hole based on the current flowing between the first electrode E1 and the second electrode E2. In this instance, the light emitted from the light emitting device 130 may pass through the first and second electrodes E1 and E2 and may be output to the outside, thereby displaying an image. In other words, the light emitted from the light emitting device 130 may pass through the first and second electrodes E1 and E2 and may be output in a second direction opposite to a first direction toward the floor surface 116a of the concave portion 116, thereby displaying an image.

Each of the plurality of pixels SP according to an embodiment of the present disclosure may further include a pixel electrode pattern AE and a common electrode pattern CE.

The pixel electrode pattern AE may electrically connect the source electrode SE of the driving TFT T2 to the first electrode E1 of the light emitting device 130. The pixel electrode pattern AE according to an embodiment may be connected to the source electrode SE of the driving TFT T2 through the first contact hole CH1 provided in the planarization layer 115 and may be directly connected to the first electrode E1 of the light emitting device 130.

The common electrode pattern CE may electrically connect the common power line CL to the second electrode E2 of the light emitting device 130. The common electrode pattern CE according to an embodiment may be connected to the common power line CL through the second contact hole CH2 provided in the planarization layer 115 and may be directly connected to the second electrode E2 of the light emitting device 130.

Each of the pixel electrode pattern AE and the common electrode pattern CE may be formed of a transparent conductive material. Examples of the transparent conductive material may include indium tin oxide (ITO), indium zinc oxide (IZO), etc., but the present embodiment is not limited thereto.

The pixel electrode pattern AE and the common electrode pattern CE may be formed through a process of depositing a transparent conductive material layer on the planarization layer 115 including the first and second contact holes CH1 and CH2 and a patterning process of selectively patterning the transparent conductive material layer through a photolithography process and an etching process. Therefore, in the present disclosure, since the first and second electrodes E1 and E2 of the light emitting device 130 are simultaneously connected to the pixel circuit PC through the deposition process and the patterning process, a process time taken in connecting the light emitting device 130 to the pixel circuit PC is considerably shortened in comparison with the related art, and thus, a productivity of the light emitting diode display device is enhanced.

In addition, the first and second electrodes E1 and E2 of the light emitting device 130 may be differently stepped, and in this instance, one of the first and second electrodes E1 and E2 may be disposed on the same plane as the top 115a of the planarization layer 115. For example, the first and second electrodes E1 and E2 of the light emitting device 130 may have differences in height relative to the floor surface 116a of the concave portion 116. In this instance, at least one of the first and second electrodes E1 and E2 of the light emitting device 130 disposed in the concave portion 116 may be stepped by less than 2 μm with respect to the top 115a of the planarization layer 115. That is, if a step height of the top 115a of the planarization layer 115 is more than 2 μm, the pixel electrode pattern AE and the common electrode pattern CE can be short-circuited by a step coverage between the top 115a of the planarization layer 115 and the first and second electrodes E1 and E2 in a line connection process of connecting the first and second electrodes E1 and E2 of the light emitting device 130 to the pixel electrode pattern AE and the common electrode pattern CE. In order to prevent the short circuit, if a thickness of each of the pixel electrode pattern AE and the common electrode pattern CE is set relatively thicker, the manufacturing cost increases due to an increase in thickness of each of the pixel electrode pattern AE and the common electrode pattern CE. In embodiments of the present disclosure, a height of the light emitting device 130 may be greater than a depth of the concave portion 116, but in other embodiments, the height of the light emitting device 130 may be less than the depth of the concave portion 116. Also, heights of the first electrode E1 and the second electrode E2 may be the same, and the pixel electrode pattern AE and the common electrode pattern CE may be co-planar.

The first substrate 110 according to an embodiment of the present disclosure may further include an adhesive layer 120 that fixes the light emitting device 130 to the concave portion 116.

The adhesive layer 120 may be disposed between the floor surface 116a of the concave portion 116 and the light emitting device 130 and may attach the light emitting device 130 on the floor surface 116a of the concave portion 116. For example, the adhesive layer 120 may be coated on the second portion 130b of the light emitting device 130 (i.e., a back surface of the first semiconductor layer 131), and thus, in a transfer process of transferring the light emitting device 130 onto the concave portion 116, the adhesive layer 120 may be adhered to the floor surface 116a of the concave portion 116. As another example, the adhesive layer 120 may be dotted onto the floor surface 116a of the concave portion 116 and may be spread in the concave 116 by pressure which is applied thereto in a transfer process performed for the light emitting device 130, and thus, may be adhered to the second portion 130b of the light emitting device 130 (i.e., the back surface of the first semiconductor layer 131). Therefore, the light emitting device 130 transferred onto the concave portion 116 may be primarily position-fixed by the adhesive layer 120. Accordingly, according to an embodiment of the present disclosure, the transfer process for the light emitting device 130 may be performed in a method of simply attaching the light emitting device 130 on the floor surface 116a of the concave portion 116, and thus, a transfer process time taken in performing the transfer process for the light emitting device 130 is shortened.

The first substrate 110 according to an embodiment of the present disclosure may further include a filler 117 surrounding a periphery of the light emitting device 130 in the concave portion 116.

The filler 117 may be filled into a peripheral space of the concave portion 116 in which the light emitting device 130 is attached. The filler 117 according to an embodiment may include a thermocurable resin or a photocurable resin. The filler 117 may be filled into the peripheral space of the concave portion 116 and then may be cured, and thus, an internal air gap of the concave portion 116 may be removed and a peripheral space top of the concave portion 116 may be planarized. Also, the filler 117 may secondarily fix a position of the light emitting device 130 which has been primarily position-fixed by the adhesive layer 120.

The filler 117 may support the pixel electrode pattern AE and the common electrode pattern CE and may prevent the pixel electrode pattern AE from electrically contacting a side surface of the active layer 133 and/or a side surface of the first semiconductor layer 131 through the peripheral space of the concave portion 116. Therefore, the pixel electrode pattern AE and the common electrode pattern CE may be formed on the filler 117 and the planarization layer 115 including the first and second contact holes CH1 and CH2, may directly contact a top surface of the filler 117, and may be electrically connected to the respective first and second electrodes E1 and E2 of the light emitting device 130.

Therefore, in an embodiment of the present disclosure, since the filler 117 is formed in the peripheral space of the concave portion 116, a step height between the top 115a of the planarization layer 115 and the peripheral space of the concave portion 116 is minimized, and thus, the pixel electrode pattern AE and the common electrode pattern CE electrically connected to the respective first and second electrodes E1 and E2 of the light emitting device 130 are prevented from being short-circuited by the step height between the top 115a of the planarization layer 115 and the peripheral space of the concave portion 116.

Furthermore, owing to the inclined surface of the concave portion 116, more of the filler 117 can be filled into the peripheral space of the light emitting device 130, thereby better fixing the light emitting device 130. The inclined surface may allow light emitted from the light emitting device 130 to travel toward the front of the concave portion 116.

The first substrate 110 according to an embodiment of the present disclosure may further include a reflective layer 111 which is disposed under the concave portion 116 to overlap the light emitting device 130.

The reflective layer 111 may be disposed between the floor surface 116a of the concave portion 116 and the first substrate 110 to overlap the light emitting device 130. The reflective layer 111 according to an embodiment may be formed of a material which is the same as that of the gate electrode GE of the driving TFT T2, and may be provided on the same layer as the gate electrode GE. The reflective layer 111 may reflect light, which is incident from the light emitting device 130, toward the second substrate 150. Accordingly, the light emitting diode display device according to an embodiment of the present disclosure may have a top emission structure.

Optionally, the reflective layer 111 may be formed of a material which is the same as that of the source/drain electrode SE/DE of the driving TFT T2, and may be provided on the same layer as the source/drain electrode SE/DE.

The second substrate 150 may be disposed to cover a portion other than the pad part of the first substrate 110, thereby protecting a pixel array provided on the first substrate 110. The second substrate 150 may be defined as a color filter array substrate, an opposite substrate, or an encapsulation substrate. For example, the second substrate 150 may be formed of a transparent glass material, a transparent plastic material, and/or the like.

The second substrate 150 according to an embodiment may include a black matrix 151.

The black matrix 151 may define an opening area overlapping an emissive area of each pixel SP provided on the first substrate 110. That is, the black matrix 151 may be provided in a light blocking area other than the opening area overlapping the emissive area of each pixel SP in a whole area of the second substrate 150, thereby preventing or reducing color mixture between adjacent opening areas. The black matrix 151 according to an embodiment may include a plurality of first light blocking patterns which cover the plurality of gate lines GL, the plurality of common power lines CL, and the pixel circuit PC of each pixel SP, a plurality of second light blocking patterns which cover the plurality of data lines DL and the plurality of driving power lines PL, and a third light blocking pattern which covers an edge of the second substrate 150. In this instance, the first to third light blocking patterns may be provided on the same layer, and thus, the black matrix 151 may have a mesh form.

In addition, the second substrate 150 may further include a light extraction layer 152 provided in the opening area defined by the black matrix 151. The light extraction layer 152 may be formed of a transparent material and may externally extract light emitted from the light emitting device 130. An opposite surface of the light extraction layer 152 facing the light emitting device 130 may have a lens form for increasing a linearity of the light emitted from the light emitting device 130. The light extraction layer 152 minimizes a step height between the opening area and a top of the black matrix 151 provided on the second substrate 150.

In an instance where the light emitting device 130 disposed in each pixel SP emits white light, the second substrate 150 may include a color filter layer 152 provided in the opening area, instead of the light extraction layer 152.

The color filter layer 152 may include a red color filter, a green color filter, and a blue color filter corresponding to respective colors defined in the plurality of pixels SP. The color filter layer 152 may transmit only light, having a wavelength of a color corresponding to a corresponding pixel SP, of the white light emitted from the corresponding pixel SP.

Optionally, the black matrix 151 and the color filter layer 152 may be provided on the first substrate 110. In this instance, the first substrate 110 may have a color filter on TFT (COT) structure.

The light emitting diode display device according to an embodiment of the present disclosure may further include a cover layer 140 that covers a top of the first substrate 110 including the pixel SP and the light emitting device 130.

The cover layer 140 may be provided between the first substrate 110 and the second substrate 150 to cover the pixel SP and the light emitting device 130. That is, the cover layer 140 may be coated on the top of the first substrate 110 including the pixel SP and the light emitting device 130, thereby protecting the pixel SP and the light emitting device 130 provided on the first substrate 110.

The cover layer 140 according to an embodiment may be formed of a thermocurable resin and/or a photocurable resin. The cover layer 140 may be directly coated on the top of the first substrate 110 in a liquid state, and then, may be cured by a curing process using heat and/or light. In this instance, a curing process for the cover layer 140 may be performed after a process of bonding the second substrate 150 to the cover layer 140 coated on the top of the first substrate 110. The cover layer 140 may buffer the press of the second substrate 150 in the process of bonding the second substrate 150 to the first substrate 110. In embodiments of the present disclosure, a portion of the cover layer 140 may be disposed between the first electrode E1 and the second electrode E2.

Optionally, the black matrix 151 and the color filter layer 152 provided on the second substrate 150 may be provided on the cover layer 140.

Figure 5:
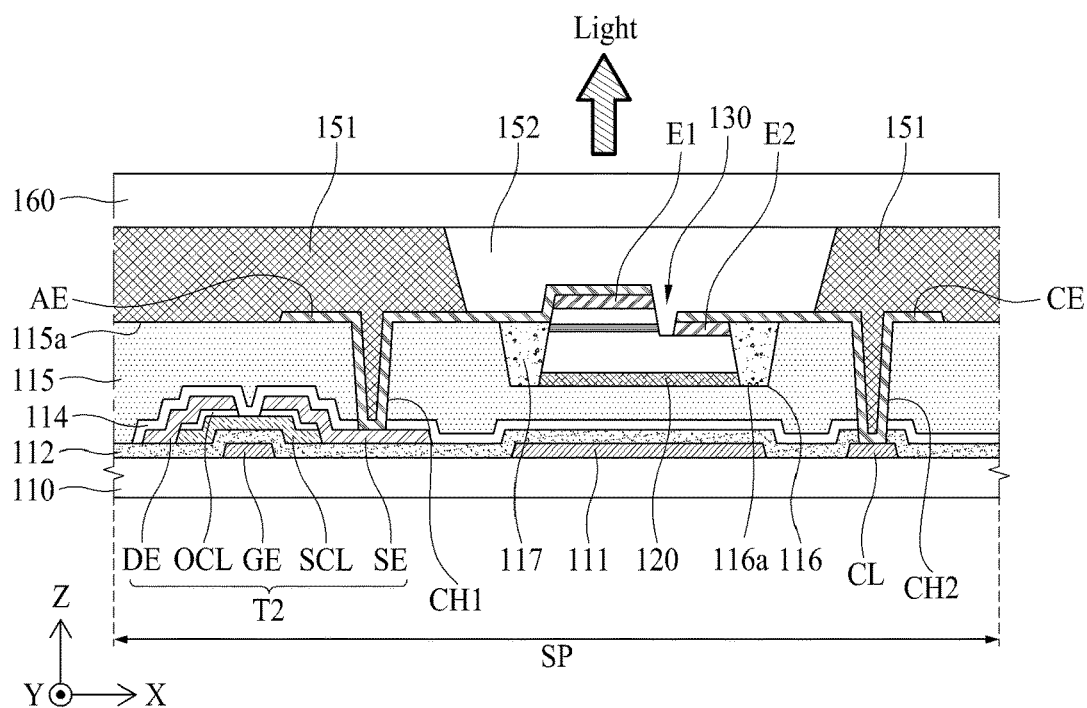
FIGS. 5 to 7 are cross-sectional views for describing a light emitting diode display device according to an embodiment of the present disclosure.

FIG. 5 is a cross-sectional view for describing a light emitting diode display device according to an embodiment of the present disclosure and illustrates a light emitting diode display device which is implemented by changing positions of the black matrix and the color filter layer in the light emitting diode display device illustrated in FIGS. 1 to 3. Hereinafter, therefore, only a black matrix, a color filter layer, and elements relevant thereto will be described.

Referring to FIG. 5, in the light emitting diode display device according to an embodiment of the present disclosure, a black matrix 151 may be directly provided on a first substrate 110 and may define an opening area overlapping an emissive area of each of a plurality of pixels SP. Also, the black matrix 151 fundamentally prevents or reduces color mixture between adjacent pixels SP, and thus, decreases a black luminance of the display device, thereby enabling the display device to realize real black. To this end, the black matrix 151 according to an embodiment may be directly formed on the first substrate 110 except a predetermined opening area and may define the opening area of each pixel SP. In more detail, except that the black matrix 151 is directly formed on a top 115a of a planarization layer 115, a pixel electrode pattern AE, and a common electrode pattern CE, the black matrix 151 according to an embodiment is the same as the black matrix illustrated in FIG. 3.

The light emitting diode display device according to an embodiment of the present disclosure may further include a light extraction layer 152 provided in the opening area defined by the black matrix 151. The light extraction layer 152 may be formed of a transparent material. The light extraction layer 152 may be directly formed on the pixel electrode pattern AE and the common electrode pattern CE overlapping the opening area of each pixel SP, thereby externally extracting light emitted from a light emitting device 130. Furthermore, the light extraction layer 152 minimizes a step height between the opening area and a top of the black matrix 151.

The light emitting diode display device according to an embodiment of the present disclosure may include a color filter layer 152 provided in the opening area, instead of the light extraction layer 152. In this instance, the light emitting device 130 disposed in each pixel SP may emit white light.

The color filter layer 152 may include a red color filter, a green color filter, and a blue color filter corresponding to respective colors defined in the plurality of pixels SP. The color filter layer 152 may transmit only light, having a wavelength of a color corresponding to a corresponding pixel SP, of the white light emitted from the corresponding pixel SP.

The light emitting diode display device according to an embodiment of the present disclosure may further include a cover layer 160 that covers the black matrix 151 and the color filter layer 152 (or the light extraction layer). The cover layer 160 protects the black matrix 151 and the color filter layer 152, and moreover, protects the pixel SP and the light emitting device 130 provided on the first substrate 110.

The cover layer 160 according to an embodiment may be formed of a thermocurable resin and/or a photocurable resin. The cover layer 160 may be directly coated on a top of the first substrate 110 in a liquid state, and then, may be cured by a curing process using heat and/or light.

In other embodiments, the cover layer 160 may be formed of a transparent glass material, a transparent plastic material, and/or the like.

In the light emitting diode display device according to an embodiment of the present disclosure, since the black matrix 151 is provided on the first substrate 110, black luminance is reduced, and thus, real black is realized.

Figure 6:
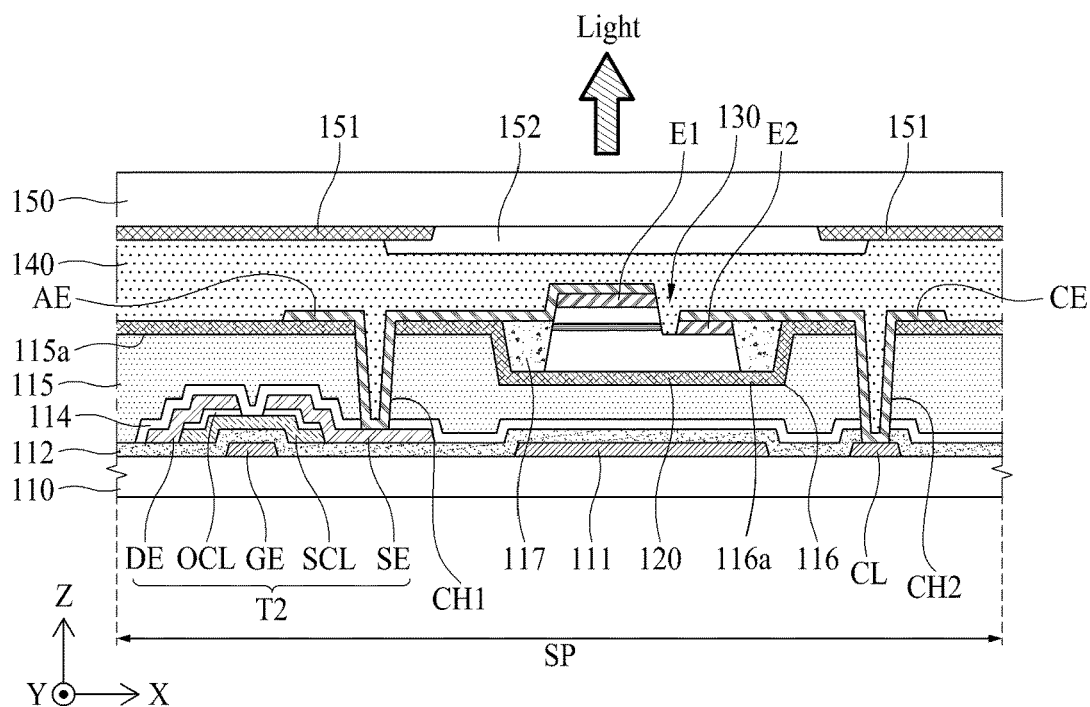

FIG. 6 is a cross-sectional view for describing a light emitting diode display device according to an embodiment of the present disclosure and illustrates a light emitting diode display device which is implemented by modifying the adhesive layer of the light emitting diode display device illustrated in FIGS. 1 to 4. Hereinafter, therefore, an adhesive layer and elements associated thereto will be described.

Referring to FIG. 6, an adhesive layer 120 of the light emitting diode display device according to an embodiment of the present disclosure may be coated on a top 115a of a planarization layer 115 and a side surface and a floor surface 116a of a concave portion 116. That is, the adhesive layer 120 may be provided to wholly cover a portion of a planarization layer 115 other than first and second contact holes CH1 and CH2 provided in the planarization layer 115.

The adhesive layer 120 according to an embodiment may be coated on the whole top 115a of the planarization layer 115, where the concave portion 116 is provided, to a certain thickness. A portion of the adhesive layer 120 coated on the top 115a of the planarization layer 115, where the first and second contact holes CH1 and CH2 are to be provided, may be removed when forming the first and second contact holes CH1 and CH2. Therefore, the adhesive layer 120 may be provided to wholly cover a portion of the planarization layer 115 other than the first and second contact holes CH1 and CH2 provided in the planarization layer 115, and thus, according to the present embodiment, a process time taken in forming the adhesive layer 120 is shortened in comparison with the embodiment of FIGS. 1 to 4.

In the present embodiment, a second portion 130b (e.g., see FIG. 4) of a light emitting device 130 may be coupled to the adhesive layer 120 coated on the floor surface 116a of the concave portion 116, and a pixel electrode pattern AE and a common electrode pattern CE may be coupled to the adhesive layer 120 coated on the top 115a of the planarization layer 115.

In the present embodiment, the adhesive layer 120 may be provided on the whole top 115a of the planarization layer 115, and thus, except that a cover layer 140 according to the present embodiment is provided to cover the adhesive layer 120, the pixel electrode pattern AE, and the common electrode pattern CE, the cover layer 140 according to the present embodiment is the same as the cover layer illustrated in FIG. 3.

Figure 7:
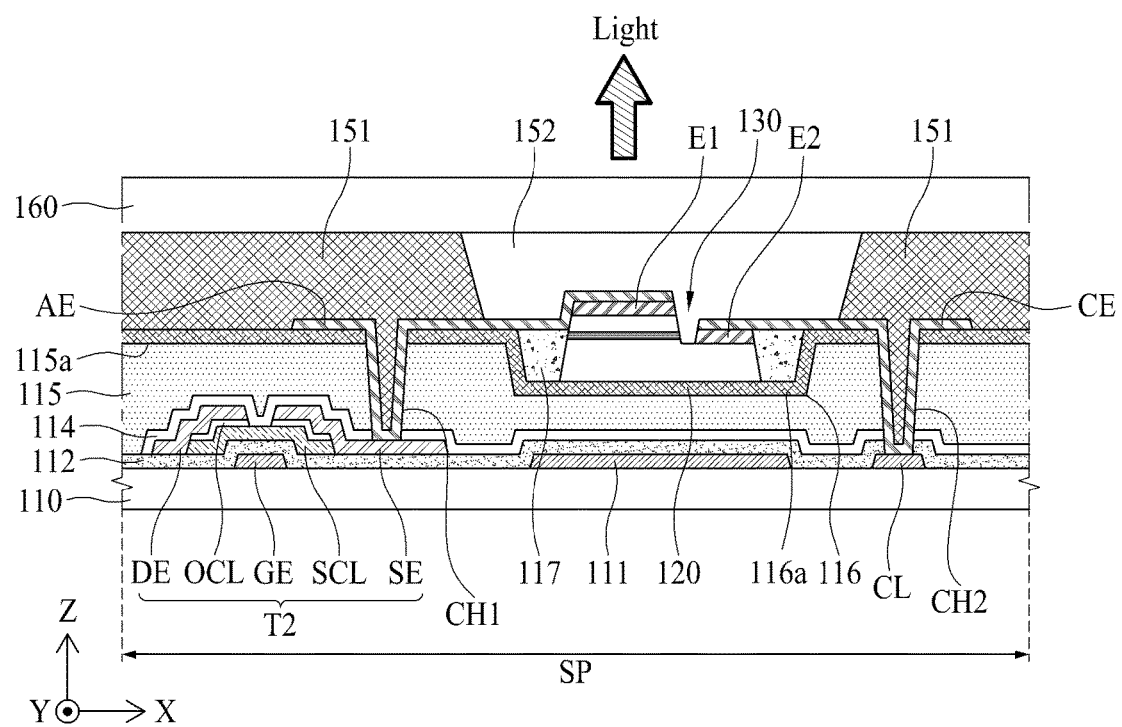

FIG. 7 is a cross-sectional view for describing a light emitting diode display device according to an embodiment of the present disclosure and illustrates a light emitting diode display device which is implemented by changing positions of the black matrix and the color filter layer in the light emitting diode display device illustrated in FIG. 6. Hereinafter, therefore, a black matrix, a color filter layer, and elements associated thereto will be described.

Referring to FIG. 7, in the light emitting diode display device according to an embodiment of the present disclosure, a black matrix 151 may be directly provided on a first substrate 110 and may define an opening area overlapping an emissive area of each of a plurality of pixels SP. Also, the black matrix 151 fundamentally prevents or reduces color mixture between adjacent pixels SP, and thus, decreases a black luminance of the display device, thereby enabling the display device to realize real black. To this end, the black matrix 151 according to an embodiment may be directly formed on the first substrate 110 except a predetermined opening area and may define the opening area of each pixel SP. In more detail, except that the black matrix 151 is directly formed on a top of an adhesive layer 120, a pixel electrode pattern AE, and a common electrode pattern CE, the black matrix 151 according to an embodiment is the same as the black matrix illustrated in FIG. 6.

The light emitting diode display device according to an embodiment of the present disclosure may further include a light extraction layer 152 provided in the opening area defined by the black matrix 151. The light extraction layer 152 may be formed of a transparent material. The light extraction layer 152 may be directly formed on the pixel electrode pattern AE and the common electrode pattern CE overlapping the opening area of each pixel SP, thereby externally extracting light emitted from a light emitting device 130. Furthermore, the light extraction layer 152 minimizes a step height between the opening area and a top of the black matrix 151.

The light emitting diode display device according to an embodiment of the present disclosure may include a color filter layer 152 provided in the opening area, instead of the light extraction layer 152. In this instance, the light emitting device 130 disposed in each pixel SP may emit white light.

The color filter layer 152 may include a red color filter, a green color filter, and a blue color filter corresponding to respective colors defined in the plurality of pixels SP. The color filter layer 152 may transmit only light, having a wavelength of a color corresponding to a corresponding pixel SP, of the white light emitted from the corresponding pixel SP.

The light emitting diode display device according to an embodiment of the present disclosure may further include a cover layer 160 that covers the black matrix 151 and the color filter layer 152 (or the light extraction layer).

The cover layer 160 according to an embodiment may be formed of a thermocurable resin and/or a photocurable resin. The cover layer 160 may be directly coated on a top of the first substrate 110 in a liquid state, and then, may be cured by a curing process using heat and/or light.

In other embodiments, the cover layer 160 may be formed of a transparent glass material, a transparent plastic material, and/or the like.

As described above, according to the embodiments of the present disclosure, a time taken in a process of connecting a light emitting device to a pixel circuit is considerably shortened, and thus, a productivity of light emitting diode display devices is enhanced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device comprising:
   a thin film transistor (TFT) array substrate including a concave portion; and
   a light emitting device in the concave portion, the light emitting device including a first portion and a second portion opposite to the first portion, the first portion including a first electrode and a second electrode,
   wherein a distance between the first portion to a floor surface of the concave portion is greater than a distance between the second portion to the floor surface of the concave portion.

2. The display device of claim 1, wherein the second portion of the light emitting device is disposed between the first portion and the floor surface of the concave portion.

3. The display device of claim 1, wherein the second portion of the light emitting device faces the floor surface of the concave portion.

4. The display device of claim 1, wherein the TFT array substrate further comprises a planarization layer including the concave portion, and
   wherein the concave portion is provided concavely from a top surface of the planarization layer.

5. The display device of claim 4, wherein the concave portion includes an inclined surface provided between the floor surface of the concave portion and the top surface of the planarization layer.

6. The display device of claim 4, further comprising:
   a pixel electrode pattern deposited on the top surface of the planarization layer and directly electrically connected to the first electrode of the light emitting device; and
   a common electrode pattern deposited on the top surface of the planarization layer and directly electrically connected to the second electrode of the light emitting device.

7. The display device of claim 4, wherein the TFT array substrate further comprises a pixel including the concave portion and the light emitting device, and
   wherein the pixel further comprises:
   a driving TFT covered by the planarization layer;
   a pixel electrode pattern electrically connected to the driving TFT through a first contact hole provided in the planarization layer, and directly connected to the first electrode of the light emitting device; and
   a common electrode pattern directly connected to the second electrode of the light emitting device.

8. The display device of claim 7, wherein the TFT array substrate further comprises:
   a driving power line electrically connected to the driving TFT and covered by the planarization layer; and
   a common power line electrically connected to the common electrode pattern and covered by the planarization layer, and
   wherein the common electrode pattern is further electrically connected to the common power line through a second contact hole provided in the planarization layer.

9. The display device of claim 8, wherein the TFT array substrate further comprises a filler at a peripheral portion of the light emitting device disposed in the concave portion.

10. The display device of claim 9, wherein the filler directly contacts the pixel electrode pattern and the common electrode pattern.

11. The display device of claim 8, wherein the light emitting device further comprises:
    a first semiconductor layer facing the floor surface of the concave portion;
    an active layer on one side of the first semiconductor layer; and
    a second semiconductor layer on the active layer,
    wherein the first electrode is provided on the second semiconductor layer and is connected to the pixel electrode pattern, and
    wherein the second electrode is provided on another side of the first semiconductor layer and is connected to the common electrode pattern.

12. The display device of claim 7, wherein:
    the TFT array substrate further comprises an adhesive layer coated on the top surface of the planarization layer and on the floor surface and a side surface of the concave portion,
    the second portion of the light emitting device is coupled to the adhesive layer coated on the floor surface of the concave portion, and
    the pixel electrode pattern and the common electrode pattern are coupled to the adhesive layer coated on the top surface of the planarization layer.

13. The display device of claim 7, further comprising:
    a black matrix on the pixel electrode pattern and the common electrode pattern,
    wherein the black matrix defines an opening area overlapping the light emitting device.

14. The display device of claim 13, further comprising a cover layer covering the black matrix and the opening area.

15. The display device of claim 4, wherein:
    the first and second electrodes of the light emitting device have differences in height relative to the floor surface of the concave portion, and one of the first and second electrodes is disposed on the same plane as the top surface of the planarization layer.

16. The display device of claim 1, wherein the TFT array substrate further comprises an adhesive layer,
    wherein the adhesive layer is disposed between the light emitting device and the TFT array substrate.

17. The display device of claim 1, wherein the first portion has a size which is smaller than that of the second portion.

18. The display device of claim 1, further comprising another substrate covering the TFT array substrate,
    wherein the another substrate comprises:
    a black matrix defining an opening area overlapping the light emitting device; and
    a color filter layer in the opening area.

19. The display device of claim 1, wherein the TFT array substrate further comprises a reflective layer under the concave portion, the reflective layer overlapping the light emitting device.

20. The display device of claim 1, further comprising an opposite substrate which is bonded to the TFT array substrate, the opposite substrate comprising:
    a black matrix defining an opening area overlapping the light emitting device; and a light extraction layer provided in the opening area defined by the black matrix.

21. The display device of claim 20, wherein an opposite surface of the light extraction layer facing the light emitting device has a lens form.

22. A display device comprising:
a thin film transistor (TFT) array substrate including a concave portion; and
a light emitting device in the concave portion, the light emitting device including a first portion and a second portion opposite to the first portion, the first portion including a first electrode and a second electrode,
wherein light emitted from the light emitting device passes through each of the first and second electrodes and is output to the outside, and
wherein a distance between the first portion to a floor surface of the concave portion is greater than a distance between the second portion to the floor surface of the concave portion.

23. The display device of claim 22, wherein the light is output in a direction toward the floor surface of the concave portion.

24. The device of claim 22, wherein the TFT array substrate further comprises:
a planarization layer including the concave portion;
a driving TFT covered by the planarization layer;
a pixel electrode pattern deposited on a top surface of the planarization layer, electrically connected to the driving TFT, and directly connected to the first electrode of the light emitting device; and
a common electrode pattern deposited on the top surface of the planarization layer and directly connected to the second electrode of the light emitting device.

25. A display device comprising:
pixels each including a driving thin film transistor (TFT) provided on a first substrate;
a planarization layer covering the pixels;
a concave portion in the planarization layer; and
a light emitting device including a first portion and a second portion opposite to the first portion, the first portion including a first electrode and a second electrode,
wherein the light emitting device is accommodated into the concave portion provided in an emissive area of a corresponding pixel of the pixels, and
wherein a distance between the first portion to a floor surface of the concave portion is greater than a distance between the second portion to the floor surface of the concave portion.

26. The display device of claim 25, further comprising a second substrate covering the first substrate, the light emitting device including the first electrode and the second electrode provided in the concave portion, and
the first and second electrodes being disposed to face the second substrate without being disposed to face the floor surface of the concave portion.

\* \* \* \* \*